US011412628B2

(12) United States Patent
Ma et al.

(10) Patent No.: US 11,412,628 B2
(45) Date of Patent: Aug. 9, 2022

(54) MODULE CONFIGURED TO REDUCE OR ELIMINATE NVH PROBLEMS OF ELECTRICAL EQUIPMENT AND ELECTRICAL EQUIPMENT

(71) Applicant: Siemens Automotive ePowertrain Systems (Shanghai) Co. Ltd., Shanghai (CN)

(72) Inventors: Yu Ma, Shanghai (CN); Zhenbing Liu, Shanghai (CN); Qi Zhang, Shanghai (CN); Bruno Condamin, Nuremberg (DE)

(73) Assignee: SIEMENS AUTOMOTIVE EPOWERTRAIN SYSTEMS (SHANGHAI) CO. LTD., Shanghai (CN)

(*) Notice: Subject to any disclaimer, the term of this patent is extended or adjusted under 35 U.S.C. 154(b) by 137 days.

(21) Appl. No.: 16/907,456

(22) Filed: Jun. 22, 2020

(65) Prior Publication Data
US 2020/0413556 A1 Dec. 31, 2020

(30) Foreign Application Priority Data
Jun. 28, 2019 (CN) .......................... 201910574906.7

(51) Int. Cl.
*H05K 5/02* (2006.01)
*H05K 5/03* (2006.01)
*H02J 7/00* (2006.01)
*H02M 7/00* (2006.01)

(52) U.S. Cl.
CPC ............ *H05K 5/0217* (2013.01); *H05K 5/03* (2013.01); *H02J 7/0042* (2013.01); *H02M 7/003* (2013.01)

(58) Field of Classification Search
CPC .... H02J 7/0042; H02M 7/003; H05K 5/0056; H05K 5/0217; H05K 5/03; H05K 5/02; H05K 7/1432
USPC ......................................................... 361/807
See application file for complete search history.

(56) References Cited

U.S. PATENT DOCUMENTS

| 5,550,712 A | * | 8/1996 | Crockett | H05K 7/142 |
| | | | | 361/752 |
| 6,295,031 B1 | * | 9/2001 | Wallace | H05K 1/0218 |
| | | | | 343/702 |
| 2013/0200828 A1 | * | 8/2013 | Miller | H02M 1/44 |
| | | | | 363/41 |

(Continued)

FOREIGN PATENT DOCUMENTS

| CN | 203930965 U | * | 11/2014 | .............. G07C 5/00 |
| JP | H07182095 A | * | 7/1995 | .............. G06F 3/03 |

*Primary Examiner* — Timothy J Thompson
*Assistant Examiner* — Guillermo J Egoavil
(74) *Attorney, Agent, or Firm* — McCormick, Paulding & Huber PLLC

(57) ABSTRACT

The invention relates to a module configured to reduce or eliminate NVH problems and electrical equipment provided with the module. Electrical equipment includes a housing; the housing includes a cover panel, a peripheral wall, and a chamber defined by the peripheral wall and the cover panel; a part of the cover panel is fastened to upper edges of the peripheral wall; and the electrical equipment further includes at least one support element which is installed inside the chamber at a distance from the peripheral wall, and is configured to support the cover panel.

13 Claims, 2 Drawing Sheets

(56) References Cited

U.S. PATENT DOCUMENTS

| | | | |
|---|---|---|---|
| 2014/0239982 A1* | 8/2014 | Alameh | G01R 27/2605 |
| | | | 324/684 |
| 2017/0133304 A1* | 5/2017 | Williams | H01L 21/565 |
| 2019/0000416 A1* | 1/2019 | Hynynen | A61B 8/4281 |
| 2019/0181407 A1* | 6/2019 | Harris | H02J 7/00308 |

* cited by examiner

MODULE CONFIGURED TO REDUCE OR ELIMINATE NVH PROBLEMS OF ELECTRICAL EQUIPMENT AND ELECTRICAL EQUIPMENT

CROSS-REFERENCE TO RELATED APPLICATION

This application claims foreign priority benefits under 35 U.S.C. § 119 to Chinese Patent Application No. 201910574906.7 filed on Jun. 28, 2019, the content of which is hereby incorporated by reference in its entirety.

TECHNICAL FIELD

The invention relates to electrical equipment, and in particular to electrical equipment having NVH (Noise, Vibration, and Harshness) problems during operation.

BACKGROUND

General electrical equipment and the components thereof are prone to noise and vibration, that is, what the industry calls NVH problems ("Noise, Vibration, and Harshness"), after being used for a period of time. Take an inverter for vehicle as an example, if the housing is not firmly joined to some components inside the inverter or if there is a gap that should not exist at the junction, the inverter is likely to have NVH problems after being used for a period of time.

Therefore, a solution is needed to eliminate or reduce the NVH problems generated by the electrical equipment.

SUMMARY

The invention provides a low-cost and efficient vibration-damping module and electrical equipment provided with the vibration-damping module, to reduce or eliminate the NVH problems generated by the electrical equipment during operation.

To achieve the above, the invention adopts the following technical solutions.

Electrical equipment includes a housing; the housing includes a cover panel, a peripheral wall, and a chamber defined by the peripheral wall and the cover panel; a part of the cover panel is fastened to upper edges of the peripheral wall; and the electrical equipment further includes at least one support element which is installed inside the chamber at a distance from the peripheral wall, and is configured to support the cover panel.

Further, the at least one support element includes at least one protrusion extending from a support panel, and the support panel is attached to the peripheral wall.

Further, the support panel is a middle panel which is fastened to the peripheral wall or to a bottom wall, the middle panel is located between the cover panel and the bottom wall, and a part of the bottom wall is attached to lower edges of the peripheral wall, wherein the middle panel divides the chamber into an upper chamber and a lower chamber.

Further, the support panel is a bottom wall, and a part of the bottom wall is attached to lower edges of the peripheral wall.

Further, the cover panel and the at least one support element are configured such that the cover panel and the at least one support element are under constraint when edges of the cover panel are fastened to edges of the peripheral wall.

Further, the at least one protrusion includes a first support end which is attached to a support area of an upper surface of the support panel; and a distance between a boundary of the support area and the peripheral wall is equal to ⅓ of one of the length and the width of the support panel.

Further, the electrical equipment further includes an auxiliary element configured to fasten the at least one support element to a lower surface of the cover panel.

Further, the auxiliary element includes an adhesive layer formed between a second support end of the at least one protrusion and the lower surface of the cover panel, so as to fasten the at least one protrusion to the lower surface of the cover panel, wherein a distance between the first support end and the second support end is the height of the at least one support element.

Further, the adhesive layer is made of a soft and flexible material, so as to absorb at least part of vibrations of the cover panel.

Further, the material of the adhesive layer is an adhesive sealant glue.

Further, the auxiliary element includes a bolt; the lower surface of the cover panel includes a bolt slot corresponding to the bolt; and a thread shape of the bolt matches a thread shape of an inner wall of the bolt slot.

Further, the at least one protrusion is a cylinder.

Further, the at least one protrusion is integrally formed with the support panel.

Further, the part of the cover panel which is fastened to the upper edges of the peripheral wall includes edges of the cover panel.

Further, the electrical equipment is an inverter, a DC-to-DC converter or an onboard charger.

DETAILED DESCRIPTION

The features and advantages of the invention will be described in detail hereinafter with reference to the drawings and embodiments. Nevertheless, the invention is not limited to the listed embodiments.

Figure 1:
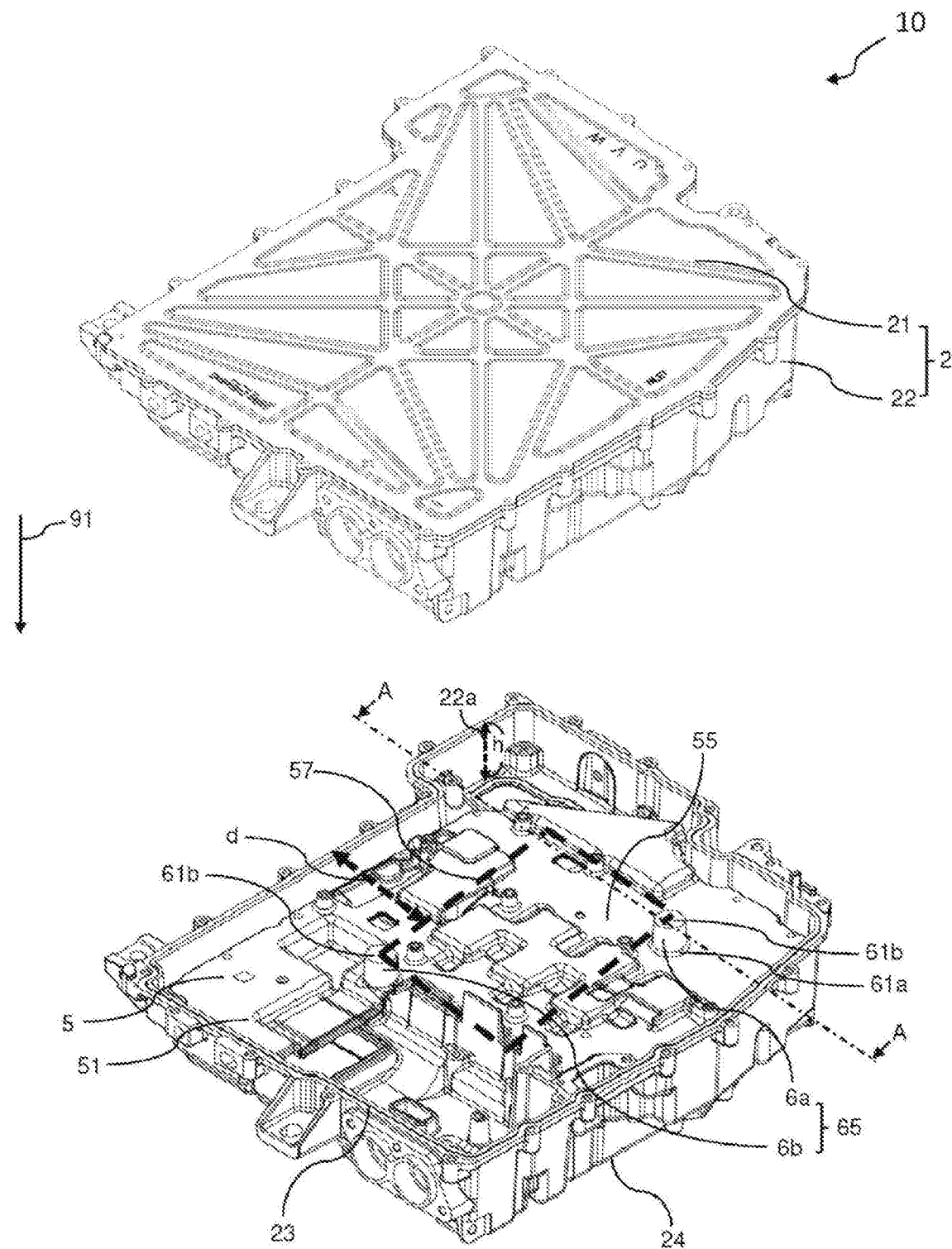
FIG. 1 is a schematic horizontal cross-sectional view of the electrical equipment according to one embodiment of the invention.
Figure 2:
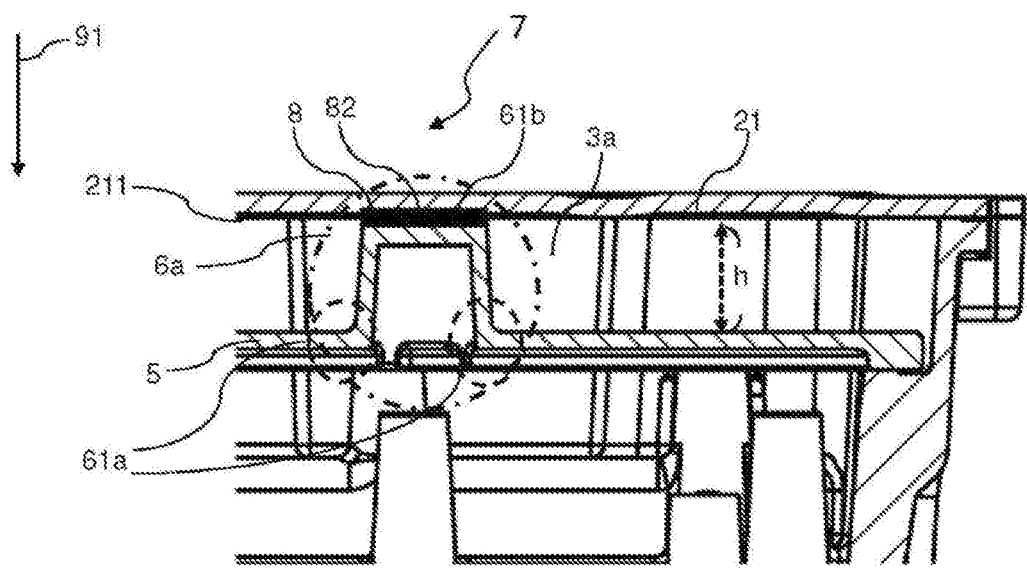
FIG. 2 is a schematic vertical cross-sectional view of the vibration-damping module according to one embodiment of the invention.
Figure 3:
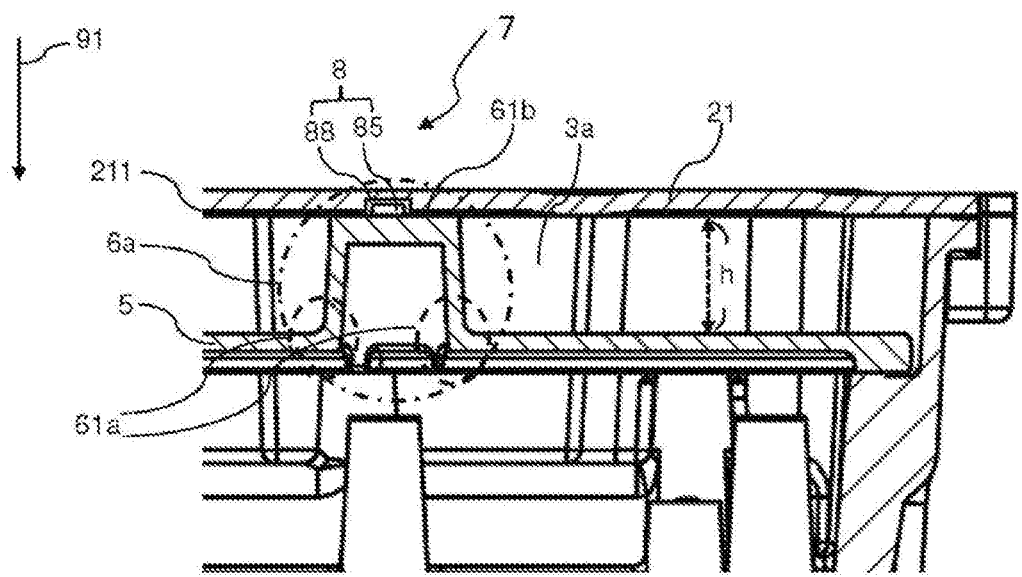
FIG. 3 is a schematic vertical cross-sectional view of the vibration-damping module according to another embodiment of the invention.

FIG. 1 is a schematic horizontal cross-sectional view of electrical equipment 10 according to one embodiment of the invention. The electrical equipment 10 includes a housing 2, a support panel, a vibration-damping module 7, and a plurality of electronic components. FIG. 2 and FIG. 3 are enlarged schematic views along the A-A vertical cross-section of FIG. 1, respectively showing different embodiments of the vibration-damping module 7. In the present embodiment, the electrical equipment 10 is an inverter for vehicle. However, in other embodiments, the electrical equipment 10 may be a DC-to-DC converter or an onboard charger.

The housing 2 includes a cover panel 21, a peripheral wall 22, and a bottom wall 24. Specifically, the bottom wall 24 may be orthogonal to the peripheral wall 22, and a part of the bottom wall 24 (for example, an edge of the bottom wall) is joined to a lower edge of the peripheral wall 22. A hollow chamber is formed between the peripheral wall 22, the cover panel 21, and the bottom wall 24, and a chamber opening is formed on the upper side of the chamber. For example, as shown in FIG. 1, the peripheral wall 22 includes four side walls 22, and the hollow chamber having a rectangular parallelepiped shape is formed between the four side walls 22, the cover panel 21, and the bottom wall 24. In addition, in accordance with the change of the shape of the component or module to be inserted, the chamber may be designed into other shapes, for example, a cylindrical chamber (not shown). In that case, the cover panel 21 and the bottom wall 24 are each a circular piece, and the peripheral wall 22 is located at an outer edge of the cover panel 21 and is orthogonal to the bottom wall 24, so as to form the chamber into a hollow cylindrical shape. In the above embodiments where the chamber has a rectangular parallelepiped shape or a cylindrical shape, the peripheral wall 22 is orthogonal to the bottom wall 24. However, in another embodiment (not shown), the peripheral wall 22 is not orthogonal to the cover panel 21 and the bottom wall 24, but is inclined outward or inward at an inclination angle of 5 to 15 degrees with respect to the bottom wall 24. In other words, any structure with the area of the chamber opening larger or smaller than the area of the bottom wall 24 or any horizontal cross-section of the chamber parallel to the bottom wall 24 also falls within the scope of the invention.

The chamber is configured to accommodate the plurality of electronic components, and the plurality of electronic components are installed on the bottom wall 24. In one preferred embodiment, the electrical equipment 10 further includes a middle panel 5, and part of the plurality of electronic components may be installed on an upper surface 51 and/or a lower surface of the middle panel 5 first. Then, in the process of assembling the components into the electrical equipment 10, the electronic components and the middle panel 5 are placed into the chamber through the chamber opening in a vertical direction 91, and an edge of the middle panel 5 is joined and fastened to the peripheral wall 22. In the present embodiment, the cover panel 21, the middle panel 5, and the bottom wall 24 are all orthogonal to the peripheral wall 22. At the end of the assembly process, the cover panel 21 is placed on the chamber in the vertical direction 91 to close the chamber opening, and the area of the cover panel 21 is slightly larger than or equal to the area of the chamber opening. In the state where the chamber opening is closed by the cover panel 21, the cover panel 21 is joined to other parts of the housing 2 only at an upper edge 23 of the peripheral wall 22. Further, a part of the cover panel 21 (for example, an edge of the cover panel 21) is fastened to the upper edge 23 of the peripheral wall 22.

In one embodiment, the thicknesses of the cover panel 21, the peripheral wall 22, the middle panel 5, and the bottom wall 24 are 3 mm, 5 mm, 5 mm, and 5 mm, respectively. The material of the cover panel 21, the peripheral wall 22, the middle panel 5, and the bottom wall 24 may be one of the following materials: plastic, aluminum, copper, aluminum alloy, copper alloy, magnesium alloy, and zinc alloy. In addition, the cover panel 21, the peripheral wall 22, the middle panel 5, and the bottom wall 24 may be made of different materials. The invention is not intended to limit the thickness or material of each part of the cover panel 21, the peripheral wall 22, the middle panel 5, and/or the bottom wall 24.

The plurality of electronic components may include a printed circuit board (PCB) module, a pulse width modulation (PWM) controller, an error amplifier, an oscillator, a short circuit protection circuit, an output transistor, etc. The invention is not intended to limit the types of the electronic components included in the plurality of electronic components.

In one embodiment, the upper surface 51 and/or the lower surface of the middle panel 5 installed with the electronic components may have one or more shallow grooves and/or corresponding low protrusions. The shape of the inner wall of the grooves matches the external shape of part of the plurality of electronic components, so as to accommodate and fasten the electronic components.

Further, the middle panel 5 includes at least one first fastening element for joining and fastening the middle panel 5 to the peripheral wall 22. The peripheral wall 22 may further include at least one second fastening element to cooperate with the at least one first fastening element to fasten the middle panel 5 to the peripheral wall 22. In one embodiment, the at least one first fastening element is a protruding fastening part formed at the edge of the middle panel 5, and the at least one second fastening element is a groove or a fastening hole located in the peripheral wall 22. The shape of the inner wall of the groove or the fastening hole matches the external shape of the protruding fastening part, which allows the groove or the fastening hole to accommodate the protruding fastening part, thereby joining and fastening the middle panel 5 to the peripheral wall 22. Thus, the middle panel 5 is located between the cover panel 21 and the bottom wall 24, and is substantially parallel to the cover panel 21 and the bottom wall 24.

The middle panel 5 divides the chamber into an upper chamber 3a and a lower chamber, and also divides the peripheral wall 22 into an upper peripheral wall 22a and a lower peripheral wall. The upper peripheral wall 22a includes the above-described upper edge 23 and is not connected to the bottom wall 24. The length of the upper peripheral wall 22a is h, which is for example 80 mm. In the state where the chamber opening is closed by the cover panel 21, the length h is the distance between the cover panel 21 and the middle panel 5, and the upper chamber 3a becomes a hollow chamber having the depth h. In one embodiment, the depth h of the upper chamber 3a may be only ¼ of the overall depth of the chamber. That is, the upper chamber 3a is a flat chamber, as shown in FIG. 1. In addition, since the upper chamber 3a between the cover panel 21 and the middle panel 5 is a hollow chamber, and between the cover panel 21 and the housing 2, there is no other element to support the cover panel 21 except for the upper edge 23 described above, when the electrical equipment 10 is operating, the cover panel 21 may generate vibration. For example, the cover panel 21 may vibrate toward the inside or outside of the upper chamber 3a in the vertical direction 91, which easily causes NVH problems in the electrical equipment 10. The situation described above also occurs easily when the electrical equipment 10 does not include the middle panel 5. That is, the chamber between the cover panel 21 and the bottom wall 24 is one hollow chamber and is not divided into the upper chamber 3a and the lower chamber by the middle panel 5. In such a case, the situation that the cover panel 21 vibrates toward the inside or outside of the chamber as described above is also likely to occur. The vibration-damping module 7 of the invention is configured to improve or eliminate the above-described NVH problems.

The vibration-damping module 7 is installed on the support panel and configured to support the cover panel 21. The support panel may be the middle panel 5 or the bottom wall 24. The vibration-damping module 7 includes at least one support element 65, which is installed inside the chamber at a distance from the peripheral wall 22. The at least one support element 65 is installed on an upper surface 51 of the support panel. In one preferred embodiment (as shown in FIG. 1 to FIG. 3), the support panel is the middle panel 5. In another embodiment (not shown), the support panel is the bottom wall 24. An edge of the support panel is fastened to the peripheral wall 22. The height of the at least one support element 65 is equal to a distance between the support panel and the cover panel 21. In the embodiment of FIG. 1 to FIG. 3, the height of the at least one support element 65 is equal to the depth h of the upper chamber 3a.

Specifically, the upper surface 51 includes a support area 55 for installing the at least one support element 65 thereon. Furthermore, the support area 55 is located in a central area of the upper surface 51 (the central area 55 shown in FIG. 1), and there is a distance d between a boundary 57 of the support area 55 and the peripheral wall 22. The distance d is the minimum distance between the position of the at least one support element 65 and the peripheral wall 22. Further, the value of the distance d may be determined according to the number of the at least one support element 65 and/or the length and/or width of the support panel. For example, in one embodiment, the distance d may be ⅓ of the length or width of the middle panel 5. The reason for setting the distance d is that the edge of the cover panel 21 is properly supported by the upper edge 23, so the at least one support element 65 does not need to be too close to the upper peripheral wall 22a (that is, the at least one support element 65 does not need to be too close to the edge of the middle panel 5). The at least one support element 65 may include a plurality of support elements 65, which are equally spaced apart from each other.

In one embodiment, the at least one support element 65 includes at least one protrusion 6a, 6b, which is respectively disposed in the support area 55 of the upper surface 51 of the support panel (for example, the middle panel 5 in the embodiment of FIG. 1). In one embodiment, the at least one protrusion 6a, 6b extends from the support panel. Specifically, the at least one protrusion 6a, 6b may be a rectangular parallelepiped or a cylinder. In the example where the at least one protrusion 6a, 6b is a cylinder, the diameter of a horizontal cross-section orthogonal to the vertical direction 91 may be 20 mm. The height of the at least one protrusion 6a, 6b is equal to the distance between the support panel and the cover panel 21. In the embodiment of FIG. 1 to FIG. 3, the height of the at least one protrusion 6a, 6b is equal to the depth h of the upper chamber 3a.

In addition, the at least one protrusion 6a, 6b of the at least one support element 65 has a first support end and a second support end. As shown in FIG. 1, each of the two protrusions 6a and 6b has a first support end 61a and a second support end 61b. The first support end 61a of each of the protrusions 6a and 6b is attached to the support area 55 of the upper surface 51 of the support panel (middle panel 5). For example, as shown in FIG. 1, the first support ends 61a are attached to the boundary 57 of the support area 55. In another embodiment (not shown), the first support end 61a of each of the protrusions 6a and 6b may be attached to a position in the support area 55 farther from the boundary 57. The second support end 61b of each of the protrusions 6a and 6b is attached to a lower surface 211 (marked in FIG. 2 and FIG. 3) of the cover panel 21 during the assembly process. In comparison with the cover panel 21 and the middle panel 5, the areas of the first support end 61a and the second support end 61b are very small, and the distance between the two support ends 61a and 61b is the height of the at least one protrusion 6a, 6b. For convenience of explanation, only the protrusion 6a and the first support end 61a and second support end 61b thereof are shown in FIG. 2 and FIG. 3. Although the protrusion 6b is not shown in FIG. 2 and FIG. 3, the protrusion 6b has substantially the same structure as the protrusion 6a.

In one embodiment, after the at least one protrusion 6a, 6b of the at least one support element 65 is manufactured, an adhesive or a fastening device is used to attach the at least one protrusion 6a, 6b to the support panel. In another embodiment, during the manufacturing process of the support panel, the at least one protrusion 6a, 6b of the at least one support element 65 is integrally formed with the support panel directly without using any adhesive or fastening device. In another embodiment, the at least one protrusion 6a, 6b and the support panel are an integrally formed structure, and the at least one protrusion 6a, 6b is a hollow cylinder, and a part of the bottom of the at least one protrusion 6a, 6b that is in contact with the upper surface 51 of the support panel is the first support end 61a having a ring shape, as shown in FIG. 1 to FIG. 3.

When a part of the cover panel 21 is fastened to the peripheral wall 22 to bring the cover panel 21 and the at least one support element 65 into contact with each other, the cover panel 21 and the at least one support element 65 exert a stress on each other. Therefore, the at least one support element 65 supports the cover panel 21 properly.

Thus, when the electrical equipment 10 is operating, the at least one support element 65 (for example, the protrusions 6a, 6b) is able to better support the cover panel 21 under normal external excitation, thereby reducing or completely eliminating the vibration of the cover panel 21. In other words, the at least one support element 65 effectively improves or eliminates the NVH problems of the electrical equipment 10 described above.

In addition, the vibration-damping module 7 further includes an auxiliary element 8 configured to fasten the at least one support element 65 to the lower surface 211 of the cover panel 21, thereby reducing or eliminating possible relative displacement between the cover panel 21 and the at least one support element 65. In the embodiment shown in FIG. 2, the auxiliary element 8 includes an adhesive layer 82 which is disposed on the second support end 61b of the at least one protrusion 6a, 6b in the vertical direction 91 to attach and fasten the second support end 61b of the at least one protrusion 6a, 6b to the lower surface 211 of the cover panel 21.

Specifically, the adhesive layer 82 is made of a soft and slightly flexible material, and therefore is able to absorb at least part of the vibration of the cover panel 21 and reduce or even eliminate possible relative displacement between the cover panel 21 and the at least one support element 65. In one embodiment, the material of the adhesive layer 82 may be an adhesive sealant glue, such as DOWSIL® 7091™ or LOCTITE® 5970™ (the latter is a silicone sealant glue). In addition, since the thickness of the adhesive layer 82 between the second support end 61b of the at least one protrusion 6a, 6b and the lower surface 211 of the cover panel 21 is very small, the thickness of the adhesive layer 82 is negligible.

FIG. 3 shows that, in another embodiment, the auxiliary element 8 may include a bolt 85, and the lower surface 211 of the cover panel 21 has a bolt slot 88 corresponding to the bolt 85. A thread shape of the inner wall of the bolt slot 88 matches an external thread shape of the bolt 85.

The vibration-damping module of the invention can be applied to various existing electrical equipment to greatly reduce the NVH problems of the electrical equipment. In a Modal Hammer Test, existing electrical equipment without the vibration-damping module of the invention was prepared as a control group, and electrical equipment with the vibration-damping module of the invention was prepared as an experimental group for conducting a modal analysis to test the effectiveness of the vibration-damping module of the invention in reducing or eliminating the NVH problems generated by the electrical equipment during operation. The electrical equipment of each of the experimental group and the control group was an inverter weighing 7.3 kg. The cover panels of the two inverters were both 500 grams and made of aluminum. The first modal frequency of the cover panel of the control group was only 220 Hz. In contrast, the first modal frequency of the experimental group rose to 450 Hz, which was closer to a target frequency of 500 Hz. The speed/amplitude of the vibration of the cover panel of the experimental group was reduced by 40% compared with the control group, which means that the vibration-damping module of the invention effectively reduces or eliminates the NVH problems generated by the electrical equipment during operation.

The vibration-damping module and the electrical equipment of the invention have several advantages. First, the manufacturing cost of the vibration-damping module is low, and the vibration-damping module is easy to install. The vibration-damping module may be installed on the middle panel or the bottom wall inside the electrical equipment without increasing the occupied space, and there is no need to greatly change the internal or external structure of the electrical equipment. Therefore, the processes of manufacturing the electrical equipment and assembling the components are very simple and do not increase the cycle time cost of production of the electrical equipment. In addition, the implementation of the vibration-damping module does not impair the waterproofness of the electrical equipment.

Nevertheless, the above are merely preferred embodiments of the invention. For those of ordinary skill in the art, it is possible to make various improvements or modifications without departing from the principles of the invention, and such improvements or modifications also fall within the scope of the invention.

What is claimed is:

1. An electrical equipment comprising a housing; the housing comprising a cover panel, a peripheral wall, and a chamber defined by the peripheral wall and the cover panel; a part of the cover panel being fastened to upper edges of the peripheral wall; the electrical equipment wherein at least one support element which is installed inside the chamber at a distance from the peripheral wall, and is configured to support the cover panel; the at least one support element comprises at least one protrusion extending from a support panel, the support panel being attached to the peripheral wall; the at least one protrusion comprising a first support end which is attached to a support area of an upper surface of the support panel; and a distance between a boundary of the support area and the peripheral wall being equal to ⅓ of one of the length or the width of the support panel, wherein the distance is a minimum distance between the position of the at least one support element and the peripheral wall.

2. The electrical equipment according to claim 1, wherein the support panel is a middle panel which is fastened to the peripheral wall or to a bottom wall, the middle panel being located between the cover panel and the bottom wall, a part of the bottom wall being attached to lower edges of the peripheral wall, wherein the middle panel divides the chamber into an upper chamber and a lower chamber.

3. The electrical equipment according to claim 1, wherein the support panel is a bottom wall, a part of the bottom wall being attached to lower edges of the peripheral wall.

4. The electrical equipment according to claim 1, wherein the cover panel and the at least one support element are configured such that the cover panel and the at least one support element are under constraint when edges of the cover panel are fastened to edges of the peripheral wall.

5. The electrical equipment according to claim 1, further comprising an auxiliary element configured to fasten the at least one support element to a lower surface of the cover panel.

6. The electrical equipment according to claim 5, wherein the auxiliary element comprises an adhesive layer formed between a second support end of the at least one protrusion and the lower surface of the cover panel, so as to fasten the at least one protrusion to the lower surface of the cover panel, wherein a distance between the first support end and the second support end is the height of the at least one support element.

7. The electrical equipment according to claim 6, wherein the adhesive layer is made of a soft and flexible material, so as to absorb at least part of vibrations of the cover panel.

8. The electrical equipment according to claim 7, wherein the material of the adhesive layer is an adhesive sealant glue.

9. The electrical equipment according to claim 5, wherein the auxiliary element comprises a bolt; the lower surface of the cover panel comprising a bolt slot corresponding to the bolt; a thread shape of the bolt matching a thread shape of an inner wall of the bolt slot.

10. The electrical equipment according to claim 1, wherein the at least one protrusion is a cylinder.

11. The electrical equipment according to claim 1, wherein the at least one protrusion is integrally formed with the support panel.

12. The electrical equipment according to claim 1, wherein the part of the cover panel which is fastened to the upper edges of the peripheral wall comprises edges of the cover panel.

13. The electrical equipment according to claim 1 being an inverter, a DC-to-DC converter or an onboard charger.

* * * * *